United States Patent
Cunha et al.

(10) Patent No.: US 10,579,751 B2
(45) Date of Patent: Mar. 3, 2020

(54) SYSTEM AND METHOD FOR CONDUCTING COMPUTING EXPERIMENTS

(71) Applicant: International Business Machines Corporation, Armonk, NY (US)

(72) Inventors: Renato Luiz de Freitas Cunha, Sao Paulo (BR); Marco Aurelio Stelmar Netto, Sao Paulo (BR); Bruno Silva, Sao Paulo (BR)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 349 days.

(21) Appl. No.: 15/294,456

(22) Filed: Oct. 14, 2016

(65) Prior Publication Data
US 2018/0107767 A1   Apr. 19, 2018

(51) Int. Cl.
G06F 17/50 (2006.01)
G06N 5/04 (2006.01)
G06N 5/00 (2006.01)
G10L 15/08 (2006.01)

(52) U.S. Cl.
CPC ......... G06F 17/5009 (2013.01); G06N 5/003 (2013.01); G06N 5/046 (2013.01); *G10L 2015/085* (2013.01)

(58) Field of Classification Search
CPC .... G06F 17/5009; G06N 5/046; G06N 5/003; G10L 2015/085
See application file for complete search history.

(56) References Cited

U.S. PATENT DOCUMENTS

| | | | |
|---|---|---|---|
| 4,710,864 A | 12/1987 | Li | |
| 5,442,730 A * | 8/1995 | Bigus | G06F 9/4881 706/19 |
| 6,240,389 B1 * | 5/2001 | Keiller | G06K 9/62 704/232 |
| 7,428,545 B2 * | 9/2008 | Bala | G06F 17/30572 |
| 7,706,616 B2 * | 4/2010 | Kristensson | G06K 9/222 382/187 |
| 9,064,005 B2 * | 6/2015 | Stensmo | G06F 16/3325 |
| 9,652,714 B2 * | 5/2017 | Achin | G06N 5/02 |
| 2002/0038342 A1 | 3/2002 | Ito | |

(Continued)

FOREIGN PATENT DOCUMENTS

WO   WO2016/004073   *  7/2016  ............... G06F 9/50

OTHER PUBLICATIONS

Minsky, M. "Steps Toward Artificial Intelligence" Proceedings of the IRE, pp. 8-30 [retrieved on Nov. 2, 2018]. Retrieved from <https://courses.csail.mit.edu/6.803/pdf/steps.pdf> (Year: 1961).*

(Continued)

*Primary Examiner* — Rehana Perveen
*Assistant Examiner* — Alfred H B Wechselberger
(74) *Attorney, Agent, or Firm* — Joseph Petrokaitis, Esq.; McGinn IP Law Group, PLLC

(57) ABSTRACT

A method of conducting computing experiments, includes executing a set of jobs, performing a comparison of a result of the executed set of jobs with templates of previously-executed experiments which are stored in a knowledge base, and identifying a prunable job of the set of jobs based on the comparison and a user constraint.

18 Claims, 9 Drawing Sheets

(56) References Cited

U.S. PATENT DOCUMENTS

| | | | |
|---|---|---|---|
| 2002/0120609 | A1 | 8/2002 | Lang et al. |
| 2003/0236761 | A1* | 12/2003 | Fiske .................. G06K 9/6255 706/46 |
| 2004/0133536 | A1* | 7/2004 | Uceda-Sosa ...... G06F 17/30604 |
| 2005/0027710 | A1* | 2/2005 | Ma .......................... G06F 17/18 |
| 2007/0185841 | A1 | 8/2007 | Jones et al. |
| 2009/0216359 | A1* | 8/2009 | McConaghy ....... G06F 17/5036 700/103 |
| 2012/0265744 | A1* | 10/2012 | Berkowitz ........ G06F 17/30873 707/705 |
| 2013/0117280 | A1* | 5/2013 | Donaldson ........ G06F 17/30129 707/748 |
| 2013/0212542 | A1 | 8/2013 | Baughman et al. |
| 2014/0114942 | A1* | 4/2014 | Belakovskiy ......... G06F 16/328 707/706 |
| 2014/0122385 | A1 | 5/2014 | Hillel et al. |
| 2014/0122390 | A1* | 5/2014 | Narisetty ............... G06N 20/00 706/12 |
| 2015/0154493 | A1* | 6/2015 | Yagnik ..................... G06N 5/02 706/14 |
| 2016/0306908 | A1* | 10/2016 | Fontes ................ G06F 17/5018 |
| 2016/0335550 | A1* | 11/2016 | Achin ....................... G06N 5/02 |
| 2017/0147719 | A1* | 5/2017 | Martinez Canedo ... G06F 17/11 |
| 2018/0299878 | A1* | 10/2018 | Cella .................... G05B 23/024 |

OTHER PUBLICATIONS

Morrison, D. "New Methods for Branch-and-Bound Algorithms" (Dissertation): Urbana, Illinois, Chapter 2 [retrieved on Nov. 2, 2018] Retrieved from <https://www.ideals.illinois.edu/handle/2142/50713> (Year: 2014).*

Dutra et al. "Toward Automatic Management of Embarrassingly Parallel Applications" Euro-Par 2003 Parallel Processing, pp. 509-516 [retrieved on Nov. 2, 2018]. Retrieved from <https://link.springer.com/chapter/10.1007/978-3-540-45209-6_73> (Year: 2003).*

Jamil, H. "Pruning Forests to Find the Trees" SSDBM '16, (Jul. 18-20, 2016), Budapest, Hungary; doi: 10.1145/2949689.2949697 [retrieved on Nov. 6, 2018]. Retrieved from <https://dl.acm.org/citation.cfm?id=2949697> (Year: 2016).*

Mejtsky, G "The Improved Sweep Metaheuristic for Simulation Optimization and Application to Job Shop Scheduling" Proceedings of the 2008 Winter Simulation Conference [retrieved on Nov. 6, 2018]. Retrieved from <https://dl.acm.org/citation.cfm?id=1516880> (Year: 2008).*

"Prune". [online] Merriam Webster [retrieved on Mar. 16, 2019]. Retrieved from <https://www.merriam-webster.com/dictionary/prune> (Year: 2019).*

Stolee, D. "TreeSeach User Guide" Version 0.9 [retrieved on Mar. 17, 2019]. Retrieved from <http://www.math.unl.edu/~s-dstolee1/Software/TreeSearchUserGuide.pdf> (Year: 2011).*

Moreno et al. "Integrating AI planning techniques with workflow management systems" Knowledge-Based Systems, vol. 15, pp. 285-291 [retrieved on Mar. 17, 2019]. Retrieved from <https://www.sciencedirect.com/science/article/pii/S0950705101001678> (Year: 2002).*

Danani et al. "Computational Steering for High Performance Computing Applications on Blue Gene/Q System" [proceedings] HPC 2015, Alexandria, VA, pp. 202-209 [retrieved on Mar. 17, 2019]. Retrieved from <https://dl.acm.org/citation.cfm?id=2872624> (Year: 2015).*

Wright et al. "Steering and visualization: Enabling technologies for computational science" Future Generation Computer Systems, vol. 26, pp. 506-513 [retrieved Mar. 17, 2019]. Retrieved from <https://www.sciencedirect.com/science/article/pii/S0167739X08000927> (Year: 2010).*

Zezula et al. "Similarity Search: The Metric Space Approach" Part of Advances in Database Systems Series, Elmagarmid, A. (Editor ) Chap 1, Section 9.1-9.2 and Chap 2 [retrieved on Mar. 29, 2019]. Retrieved from <https://link.springer.com/book/10.1007%2F0-387-29151-2> (Year: 2006).*

Hand et al. "Search and Optimization Methods" Chapter 8 in Principles of Data Mining, MIT Press [retrieved on Mar. 29, 2019]. Retrieved from <https://ieeexplore.ieee.org/document/6282065> (Year: 2001).*

Koontz et al. "A Branch and Bound Clustering Algorithm" IEEE Transactions on Computers, vol. C-24, No. 9, pp. 908-914 [retrieved on Sep. 29, 2019]. Retrieved from <https://dl.acm.org/citation.cfm?id=1311529> (Year: 1975).*

Nascimento et al. "User hints: a framework for interactive optimization" Future Generation Computer Systems, vol. 21, pp. 1177-1191 [retrieved on Oct. 4, 2019]. Retrieved from <https://www.sciencedirect.com/science/article/pii/S0167739X04000494> (Year: 2005).*

Baltes et al. "Case-based Meta Learning: Sustained Learning supported by a Dynamically Biased Version Space" [retrieved on Oct. 4, 2019]. Retrieved from <https://pdfs.semanticscholar.org/10dc/bb8df98e2dd1139dd82316bb55e7f06b0fc8.pdf?_ga=2.89287897.356795074.1570243952-502337382.1558291767> (Year: 1992).*

Leite et al. "Selecting classification algorithms with active testing" MLDM 2012, pp. 117-131 [retrieve Oct. 14, 2019]. Retrieve from <https://www.researchgate.net/profile/Joaquin_Vanschoren/publication/260311386_Selecting_Classification_Algorithms_with_Active_Testing/links/55ca0be008aeb975674a400f.pdf> (Year: 2012).*

Van Hentenryck et al. "Incremental Search in Constraint Logic Programming" New Generation Computing, vol. 9, pp. 257-275 [retrieved on Oct. 8, 2019]. Retrieved from <https://link.springer.com/content/pdf/10.1007/BF03037165.pdf> (Year: 1991).*

Shih et al. "Template-Based Real-Time Dwell Scheduling with Energy Constraint" RTAS '03, p. 19 [retrieved on Oct. 9, 2019]. Retrieved from <https://ieeexplore.ieee.org/iel5/8555/27075/01203033.pdf> (Year: 2003).*

* cited by examiner

SYSTEM AND METHOD FOR CONDUCTING COMPUTING EXPERIMENTS

BACKGROUND

The present invention relates generally to system and method of conducting computing experiments, and more particularly, a system and method of conducting computing experiments which includes executing a set of jobs, performing a comparison of a result of an executed set of jobs with templates of previously-executed experiments, and identifying one or more prunable jobs of the set of jobs based on the comparison and a user constraint.

One of the biggest challenges when evaluating what if scenarios and calibrating simulation models is determining how a search through the state space should be done (i.e., which parameters should be evaluated first, and how to change these values in a wise manner) in order to maximize cost- and time-efficiency.

Frequently, fully automatic solutions are adopted to solve non-trivial activities such as scheduling, routing, and optimization problems. General solutions of these problems involve strategies to maximize/minimize the generated results and escape from non-optimal outputs.

SUMMARY

An exemplary aspect of the present invention is directed to a method of conducting computing experiments. The method includes executing a set of jobs, performing a comparison of a result of the executed set of jobs with templates of previously-executed jobs which are stored in a knowledge base, and identifying a prunable job of the set of jobs based on the comparison and a user constraint.

Another exemplary aspect of the present invention is directed to a system for conducting computing experiments. The system includes a job executing module for executing a set of jobs, a knowledge base for storing templates of previously-executed experiments, a comparing module for performing a comparison of a result of the executed set of jobs with the templates stored in the knowledge base, and a prunable job identifier for identifying a prunable job of the set of jobs based on the comparison and a user constraint.

Another exemplary aspect of the present invention is directed to a computer program product for conducting computing experiments, the computer program product including a computer readable storage medium having program instructions embodied therewith, the program instructions executable by a computer to cause the computer to execute a set of jobs, perform a comparison of a result of the executed set of jobs with templates of previously-executed experiments which are stored in a knowledge base, and identify a prunable job of the set of jobs based on the comparison and a user constraint.

With its unique and novel features, the exemplary aspects of the present invention may assist a user (e.g., a human user) in guiding experiments in a way that maximizes business impact by modeling user behavior, predicting/simulating how such a behavior would fare, and providing feedback to the user.

BRIEF DESCRIPTION OF THE DRAWINGS

The exemplary aspects of the present invention will be better understood from the following detailed description of the exemplary embodiments of the invention with reference to the drawings, in which.

DETAILED DESCRIPTION

Figure 1:
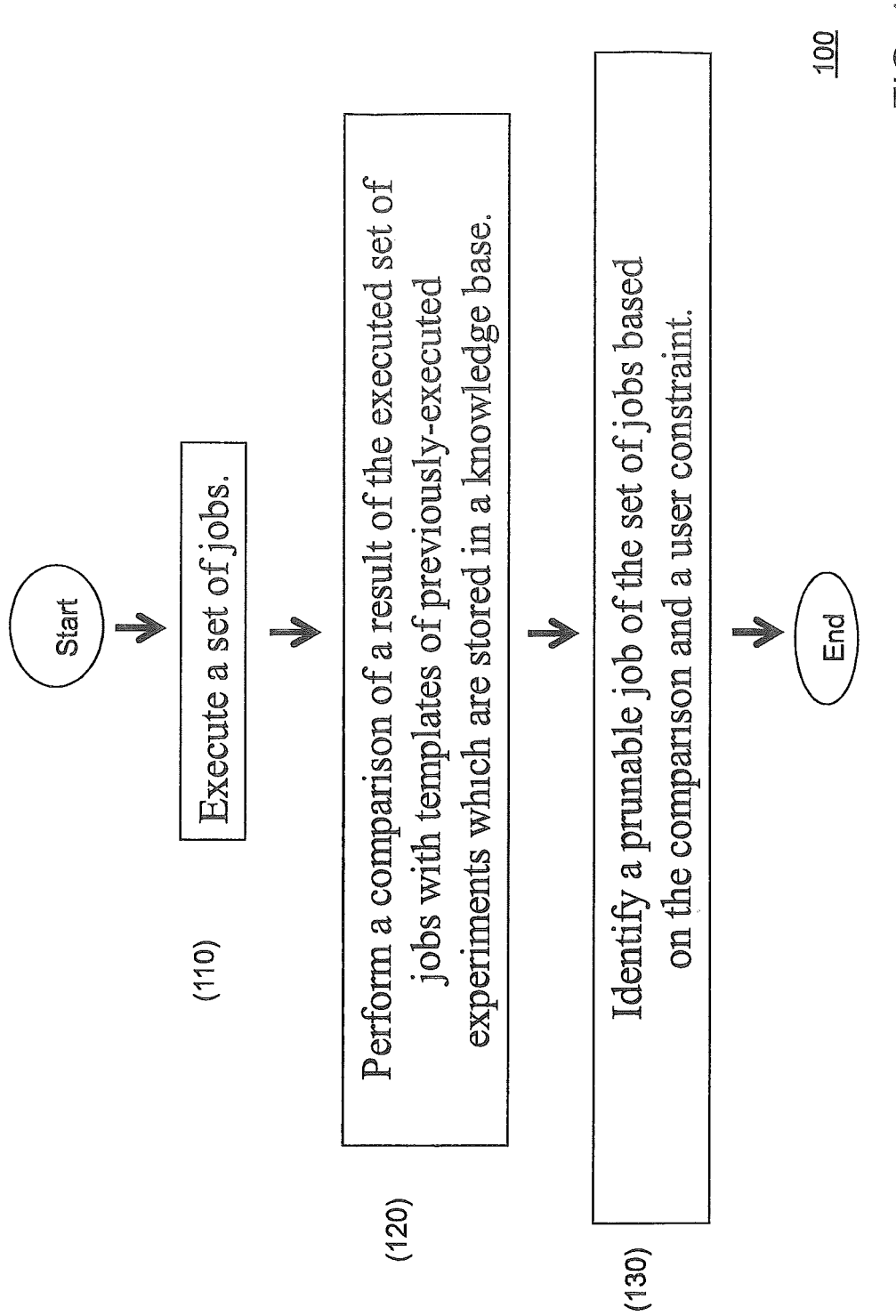
FIG. 1 illustrates a method 100 according to an exemplary aspect of the present invention.

The invention will now be described with reference to FIGS. 1-9, in which like reference numerals refer to like parts throughout. It is emphasized that, according to common practice, the various features of the drawing are not necessarily to scale. On the contrary, the dimensions of the various features can be arbitrarily expanded or reduced for clarity. Exemplary embodiments are provided below for illustration purposes and do not limit the claims.

A problem with related art strategies of maximizing/minimizing generated results is that the strategies depend on a set of instructions that need to be coded, and human expertise may not be easily coded or captured. Such expertise influences how the optimization solutions navigate in the search space.

An exemplary aspect of the present invention, on the other hand, may assist a user (e.g., a human user) in guiding experiments in a way that maximizes business impact by modeling user behavior, predicting/simulating how such a behavior would fare, and providing feedback to the user on whether such behavior would meet deadlines (and suggesting new areas for exploration in cases when user's behavior can be improved).

In the exemplary system and method of the present invention, the user has a problem to solve (e.g. calibrate a model, find the best solution for an optimization problem, etc.). To solve this problem, the user has to run an experiment.

Each experiment consists of a set of jobs, which is a software plus a set of input parameters. Each parameter can assume a value (it can be a number or a category). Therefore, pruning a group of jobs means not executing a group of jobs with a range of parameter-values.

In an exemplary aspect of the present invention, one or more templates may be created for each experiment. Similar problems can use these templates to prune jobs of a new experiment. Therefore, it is possible to prune a group of jobs based on a given template from previous experiment.

These "prunable" jobs will probably not produce relevant results. In addition, these jobs (which are part of a set of experiments), may be executed in "waves" . . . batches of jobs. Thus, a user may execute a batch of jobs, then check/analyze the results, think about the results, and run another batch of jobs until all jobs are executed or the desired solution is achieved.

Referring again to the drawings, FIG. 1 illustrates a method 100 according to an exemplary aspect of the present invention.

As illustrated in FIG. 1, the method 100 includes executing (110) a set of jobs, performing (120) a comparison of a result of the executed set of jobs with templates of previously-executed experiments which are stored in a knowledge base, and identifying (130) a prunable job (e.g., one or more prunable jobs) of the set of jobs based on the comparison and a user constraint (e.g., one or more user constraints).

In an exemplary aspect of the present invention, the templates can be used to speed-up the experiments by providing a direction in which better results are located.

The method 100 may also include inputting the user constraint and a required solution, the user constraint including at least one of a time constraint, a cost constraint and a service level agreement constraint, and selecting an initial set of parameters to be analyzed. The method 100 may also include, in a job generator, generating the set of jobs based on the selected initial set of parameters, and sorting the generated set of jobs according to user strategy and triggering the executing (110) of the set of jobs according to resource availability.

For a given experiment, the jobs may have the same number of parameters (for example, p). Each job may have p parameters ($p\_1, p\_2, p\_3, \ldots, p\_p$) and each parameter may assume several values.

The user may select the parameter values for each job. Then, each job may receive p parameter values ($v1, v2, v3, \ldots, v\_p$).

The initial set of parameter values may be selected, for example, either manually by the user or automatically by the job generator, or some combination of the two.

The user may also be prompted to accept or not accept the identified prunable jobs. In particular, the user may be prompted to accept or not accept the identified prunable jobs, by generating a display for displaying a relationship between parameter values and goals. The display may include, for example, a graph plotting parameter values versus goals. It should be noted that one or more jobs may be identified as prunable.

Further, if the user accepts the identified prunable jobs, then the prunable jobs may be deleted, and the set of jobs, excluding the prunable jobs, may be executed. If, on the other hand, the user does not accept the identified prunable jobs, then the set of jobs, including the prunable jobs, may be executed. Further, prior to executing the set of jobs, the user may be prompted to reprioritize the set of jobs.

After the executing (110) of the set of jobs, it may be determined whether the executing of the set of jobs results in a solution or whether there are no jobs to be executed. If it is determined that the executing of the set of jobs has resulted in a solution or that there are no jobs to be executed, then the templates in the knowledge base may be updated, and the executing of the set of jobs is terminated (i.e., the experiment is concluded). If, on the other hand, it is determined that the executing of the set of jobs has not resulted in a solution or that there are jobs remaining to be executed, then the comparison of the result of the executed set of jobs with the templates of previously-executed experiments may be performed.

Figure 2:
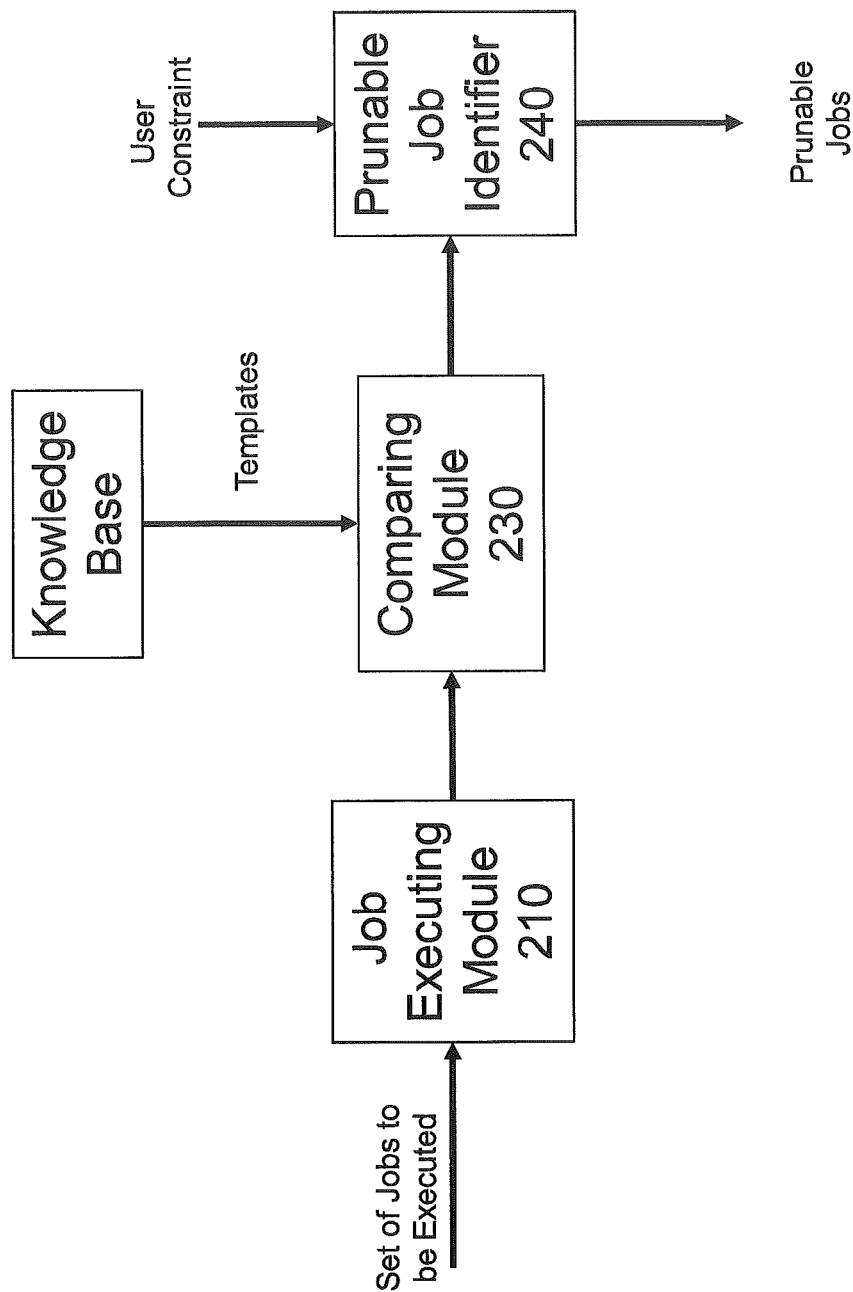
FIG. 2 illustrates a system 200 for conducting computing experiments, according to an exemplary aspect of the present invention.

Referring again to the drawings, FIG. 2 illustrates a system 200 for conducting computing experiments, according to an exemplary aspect of the present invention.

As illustrated in FIG. 2, the system 100 includes a job executing module 210 for executing a set of jobs, a comparing module 230 for performing a comparison of a result of the executed set of jobs with the templates stored in a knowledge base, and a prunable job identifier 230 for identifying a prunable job (e.g., one or more prunable jobs) of the set of jobs based on the comparison and a user constraint (e.g., one or more user constraints).

The knowledge base may be formed as part of the system 200. For example, where the system 200 includes a server, the knowledge base may be included in the hard drive or other memory device (e.g., random access memory (RAM), read only memory (ROM)) in the server or connected to the server. Alternatively, the knowledge base may be stored remotely (e.g., in the cloud) so as to be accessible to the system 200.

One or more user constraints (e.g., time constraint, cost constraint, service level agreement constraint, etc.) may be input to the prunable job identifier 240 and may be used by the prunable job identifier 240 to identify a prunable job (e.g., one or more prunable jobs). That is, the user constraints may determine a level of aggressiveness of pruning suggestions made by the prunable job identifier 240. For example, if the user inputs a time constraint of six (6) hours (i.e., the experiment must be concluded in six (hours) the pruning suggestions made by the prunable job identifier 240 may be more aggressive than if the user inputs a time constraint of ten (10) hours.

The user constraints may be defined, for example, by an analyst which is a system agent that may ultimately define which jobs will be executed and the order in which the jobs will be executed. The analyst may also define a required solution to a problem to be solved by the system.

The system 200 may also include a job generator for defining a time constraint and a cost constraint and a required solution, selecting an initial set of parameters to be analyzed, generating the set of jobs based on the selected initial set of parameters, and sorting the generated set of jobs according to user strategy and triggering the executing of the set of jobs according to resource availability. The job generator may also prompt a user (e.g., a person conducting the experiment on the system 200) to select the initial set of parameters, or may automatically select of the initial set of parameters.

The system 200 may also include a prompting module for prompting a user to accept or not accept the identified prunable job. For example, the prompting module may prompt the user to accept or not accept the identified prunable job, by generating a display for displaying a relationship between parameter values and goals. The display may include, for example, a graph plotting parameter values versus goals.

The system 200 may also include a prunable job deleting module for, if the user accepts the identified prunable job, deleting the prunable job. In this case, the job executing module 210 may execute the set of jobs excluding the prunable job. If, on the other hand, the user does not accept the identified prunable job, then the job executing module 210 may execute the set of jobs including the prunable job.

Figure 3:
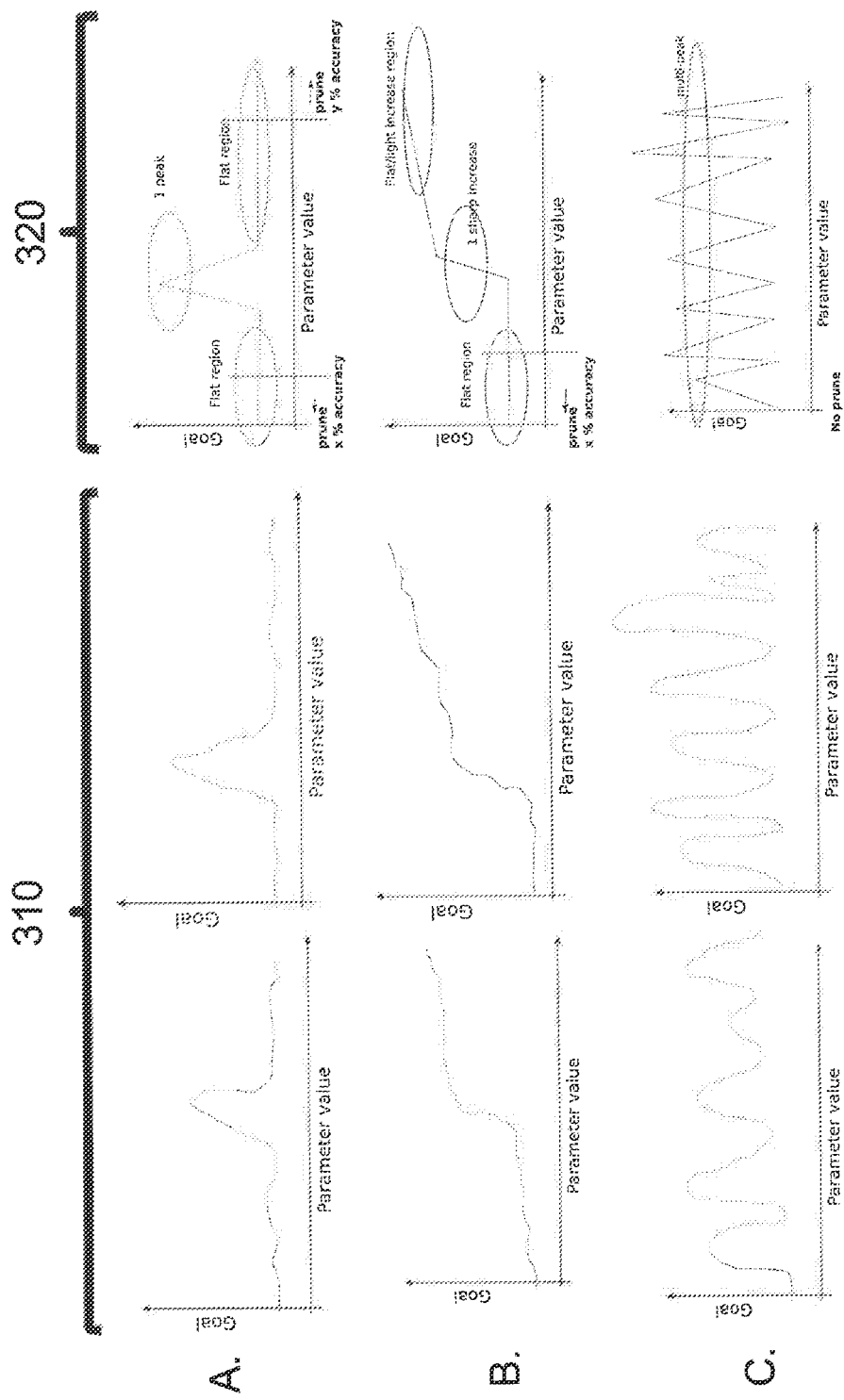
FIG. 3 illustrates a use of templates (e.g., templates stored in a knowledge base), according to an exemplary aspect of the present invention.

FIG. 3 illustrates a use of templates (e.g., templates stored in a knowledge base), according to an exemplary aspect of the present invention.

In particular, FIG. 3 illustrates two columns (310 and 320) of graphs which plot goals versus parameter value.

Examples of parameters include speed, pressure, capacity, temperature, and so on. Examples of goals include water level measured by a sensor, minimizing user response time, maximizing throughput, protein folded similar to a defined format, and so on.

The graphs in Column 310 are examples of the results of executed jobs, and the graphs in Column 320 illustrate the template (based on previously-executed experiments) which may be identified by the invention (e.g., using a pattern recognition technique) as having a pattern similar to a pattern of the executed jobs in Column 310.

In an exemplary aspect of the present invention, the term "pattern" may include an arrangement of plot points on a graph plotting a goal (e.g., water level) vs. parameter values (e.g., temperature values). However, the term "pattern" is not necessarily limited to such an arrangement of plot points but may include other patterns (e.g., designs, lines, configurations, arrangements, etc.) which are based on previously-executed experiments.

Thus, for example, in Row A in FIG. 3, based on the results in the two graphs in Column 310, the system 200 may identify the template in Column 320 in which the plot of goal versus parameter value includes a pair of flat regions separated by one peak. A "flat region" in the graphs of the template in Column 320 is a region where an increase in the parameter value results in little advancement (e.g., improvement) toward the goal.

The template may further indicate that jobs in the flat region with the lowest parameter values could be pruned with x % confidence level, and that jobs in the flat region with the highest parameter values could be pruned with y % confidence level. The confidence level is calculated by using the hit percentage of previous jobs that were predicted to be in flat regions. Thus, the user may instruct the system 200 to prune some of the jobs in the flat regions of the template in Row A of Column 320.

In Row B in FIG. 3, based on the results in the two graphs in Column 310, the system 200 may identify the template in Column 320 in which the plot of goal versus parameter value includes one flat region for the lowest parameter values. The template may further indicate that jobs in the flat region could be pruned with x % of confidence level. Thus, the user may instruct the system 200 to prune some of the jobs in the flat region of the template in Row B of Column 320.

In Row C in FIG. 3, based on the results in the two graphs in Column 310, the system 200 may identify the template in Column 320 in which the plot of goal versus parameter value includes multiple peaks, but no flat regions. In this case, the system 200 may recommend that no jobs be pruned by the user. That is, the system 200 has identified no prunable jobs.

As illustrated in FIG. 3, in an exemplary aspect of the present invention, the user (e.g., a human user who is conducting a simulation experiment) may stay involved in the execution of the jobs. That is, the system 200 is not necessarily totally automated. The user may decide prune based on the suggestion in Column 320, and this decision by the user may be fed back into the knowledge base in order to update the knowledge base with the user's preferences.

To determine "patterns", the system 200 may look at an output of a model using particular input parameters. That is, the patterns (e.g., templates) are features of the output that are common in several collected previous experiment sets, which were generated by particular input parameters.

For instance, a pattern can be (i) flat with one peak; (ii) steady, sharp increase, light increase; etc. In practical terms, for instance, if a user wants to calibrate a flooding model, several previous experiments may show that when it rains less than a given threshold (which is a parameter of the model), the result will be flat and therefore jobs with that input parameter-value can be pruned.

An exemplary aspect of the present invention may use pattern recognition to trigger a pruning suggestion to the user. The pruning suggestion may also take into account service level agreement (SLA) requirements (e.g., the tighter the deadline, the more aggressive is the pruning).

To get from the pattern recognition to the rules:

1. The identification of the pattern (e.g., template) may be performed automatically via a pattern recognition technique.

2. The pruning rules can be created, for example, in two ways:

a) Solely done by the user: The user will identify what he/she feels comfortable pruning on the patterns (e.g., templates). In Row A of FIG. 3, the user may specify: "once this pattern is identified, prune all Jobs that have probability of generating flat goal". For the second row of figures, the user may specify two possibilities: "once this pattern is found, prune all jobs that have probability of generating flat goals, or prune all Jobs that may generate flat goals or contain sharp increase". The far right column show examples of areas that could be pruned.

b) Automatically based on users previous prunings: Similar as the previous way, however in this case, the user performs pruning actions on experimental sets. These prunings are recorded and common prunings for a given pattern (e.g., template) are learned (e.g., via machine learning techniques such as inductive logic programming (ILP)).

Referring again to FIG. 2, the templates that are stored in the knowledge base (e.g., user-domain-expertise knowledge base) which is accessible to the system 200, may be generated (e.g., constructed) based on previously-performed simulation experiments.

The system 200 may also include a parameter-value prioritization device for prioritizing a parameter-value based on an execution of a previous experiment to increase confidence of pruning suggestions. Further, the job executing module 210 may execute jobs by executing software using a plurality of input parameters (e.g., parameters that may be input by the user and can assume multiple values). The parameter-value prioritization device may prioritize a parameter-value based on a similarity between a currently performed experiment, and the templates of the previously performed simulation experiments.

The parameter-value prioritization may be performed, for example, by considering a user selection of parameter values based on similar pattern outputs. Correlation between input parameters and pattern outputs can be done automatically via clustering techniques or Root Mean Square Error calculation.

The system 200 may also include an input device (e.g., keyboard, mouse, touchscreen, etc.) for inputting a user-assistant strategy for prioritizing the parameter-values of the plurality of input parameters.

The system 200 may also include a machine learning device (e.g., an inductive logic programming (ILP) device) for building the knowledge base (e.g., rules) including templates of parameter value relationships of other executed experiments.

The system 200 may also include a notification device for notifying a user of templates of parameter value relationships of other executed experiments, and pruning suggestions for pruning groups of parameter-values during an execution of experiments. The pruning suggestions may be based, for example, on user risk assessment and deadline and cost constraints to run the all required experiments.

The system 200 may also include a splitting device for splitting computing resources and pending experiments to handle different goals. The goals may include, for example, looking for patterns (e.g., templates), looking for better solutions, exploring to acquire knowledge or confirm a hypothesis, etc.

This feature may allow the user to dedicate experiments for different goals. For instance, the user may say "I want to dedicate 10% of jobs to hunt for templates, 70% to find for better solutions, and 10% to explore parameter-values that I would normally ignore".

First, regarding the hunt for templates, while jobs are running, the templates may be analyzed and discarded. For templates under analysis, it may be impossible to answer if the template should be discarded because jobs that could answer these questions have not executed yet. The 10% computing power could be used to prioritize these jobs to answer the question. The answer of the question may help user to receive pruning suggestions. Root Mean Square Error can be used to determine the similarity between templates and results of completed jobs.

Second, regarding the search for better solutions, jobs could be prioritized based on, for example, Design of Experiment or classical optimizating methods (gradient-descent-based method).

Third, regarding the acquiring of knowledge, random or user-defined parameter-values may be used.

Figure 4:
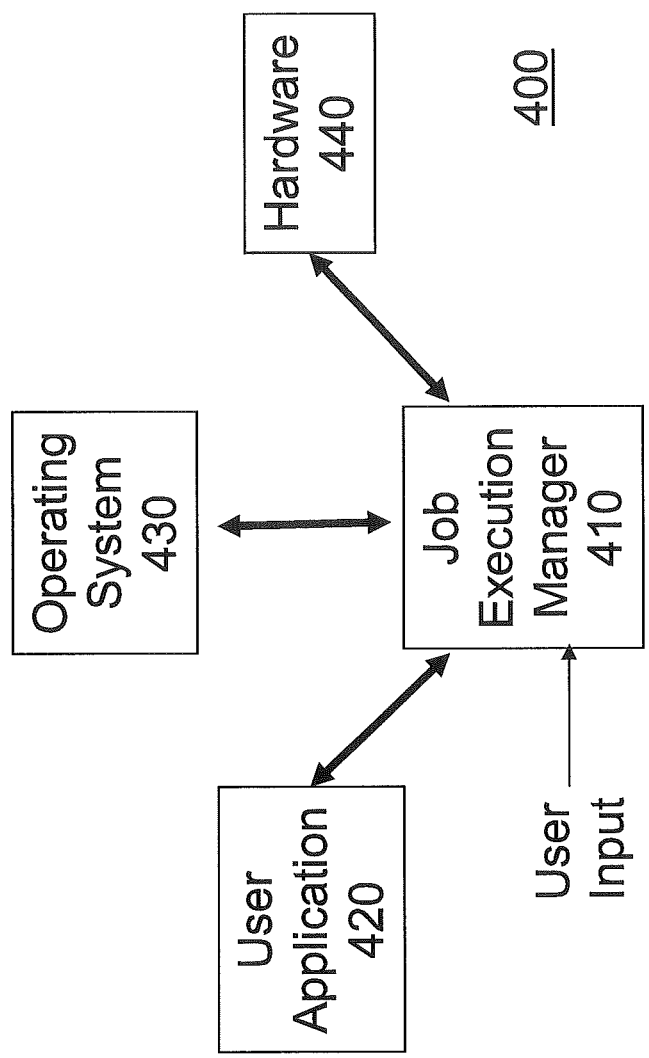
FIG. 4 illustrates a system 400 according to another exemplary aspect of the present invention.

Referring again to the drawings, FIG. 4 illustrates a system 400 according to another exemplary aspect of the present invention.

As illustrated in FIG. 4, the system 400 includes a job execution manager 410 (e.g., a software system to help the user achieve the user's goal) which may correspond, for example, to the system 200. The system 400 may further include a user application 420, an operating system 430 and hardware 440 which interface with (e.g., are accessible by) the job execution manager 410. In particular, the job execution manager 410 may control the user application 420, operating system 430 and hardware 440.

As also illustrated in FIG. 4, a user (e.g., analyst) may input data to the job execution manager 410. The user may include, for example, a human user with a goal such as to calibrate a simulation model or perform an optimization for problems such as scheduling or routing. The user may have access to an application that can be executed with a variety of parameters, where each parameter can assume a variety of values.

The user application 420 may include a software system that performs an optimization process, such as scheduling or routing. The operating system 430 may include a software system that manages computer hardware and software resources (e.g., GNU/Linux, Windows, and OS X). The operating system 430 can also be a cluster management system.

The hardware 440 may include a collection of physical parts of a computer system. The hardware 440 could also be a single computer device or a cluster of computers and processors.

Figure 5:
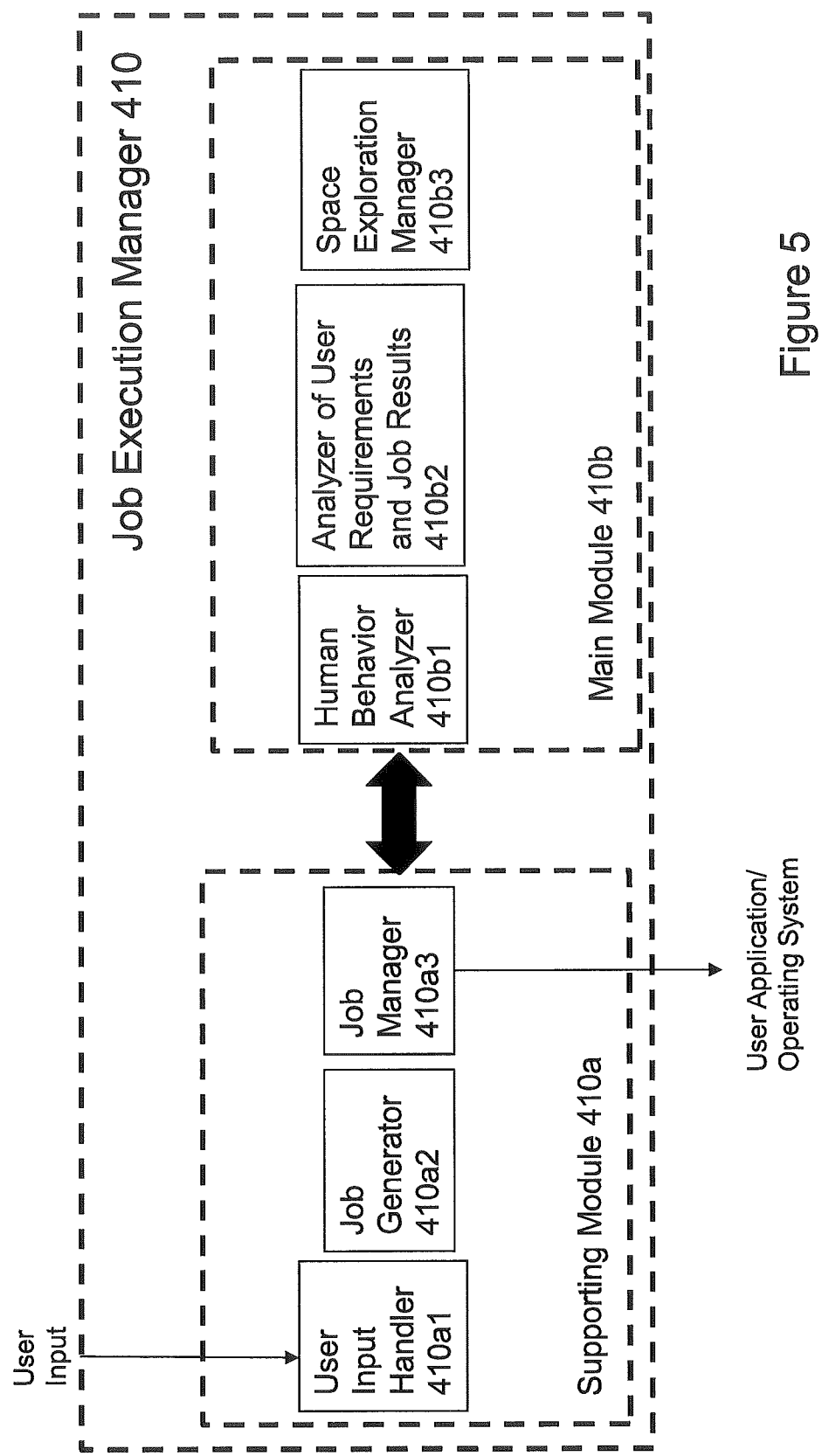
FIG. 5 illustrates a detailed view of the job execution manager 410, according to another exemplary aspect of the present invention.

Referring again to the drawings, FIG. 5 illustrates a detailed view of the job execution manager 410, according to another exemplary aspect of the present invention.

As illustrated in FIG. 5, the job execution manager 410 includes a supporting module 410a and a main module 410b which may be coupled (e.g., wirelessly or by wire) to the supporting module 410a. The supporting modules 410a may generate and trigger jobs based on the user parameters as well as time and cost constraints. The main modules, may be responsible for learning user behavior and suggesting changes to the user if this behavior leads to requirement violations.

The supporting module 410a may include a user input handler 410a1, a job generator 410a2 and a job manager 410a3. The main module 410b may include a human behavior analyzer 410b1, an analyzer of user requirements and job results 410b2 and a space exploration manager 410b3.

The user input handler 410a1 may receive user input, which can be application parameters and their values, requirements/constraints in terms of budget and deadline, or specification of hardware to run the application.

The job Generator 410a2 may translate application parameters into a set of jobs to be executed. A "job" may be considered to be a specification (generally in text format) with the location of the user application and the parameters to be used as input.

The job manager 410a3 may handle submission, tracking, cancellation and re-prioritization of the jobs.

The human behavior analyzer 410b1 may analyze and store information on how the user is interacting with jobs. For instance, the user may be "interacting with jobs" by exploring a certain set of parameters, by varying the parameters more broadly, etc.

The analyzer of user requirements and job results 410b2 may keep track of the quality of the results generated by completed jobs and requirements/constraints of the user such as budget and deadline.

The space exploration manager 410b3 may determine how application parameter values need to be chosen based on strategies such as Latin Hypercube, Orthogonal Arrays, and Monte Carlo sampling.

Figure 6:
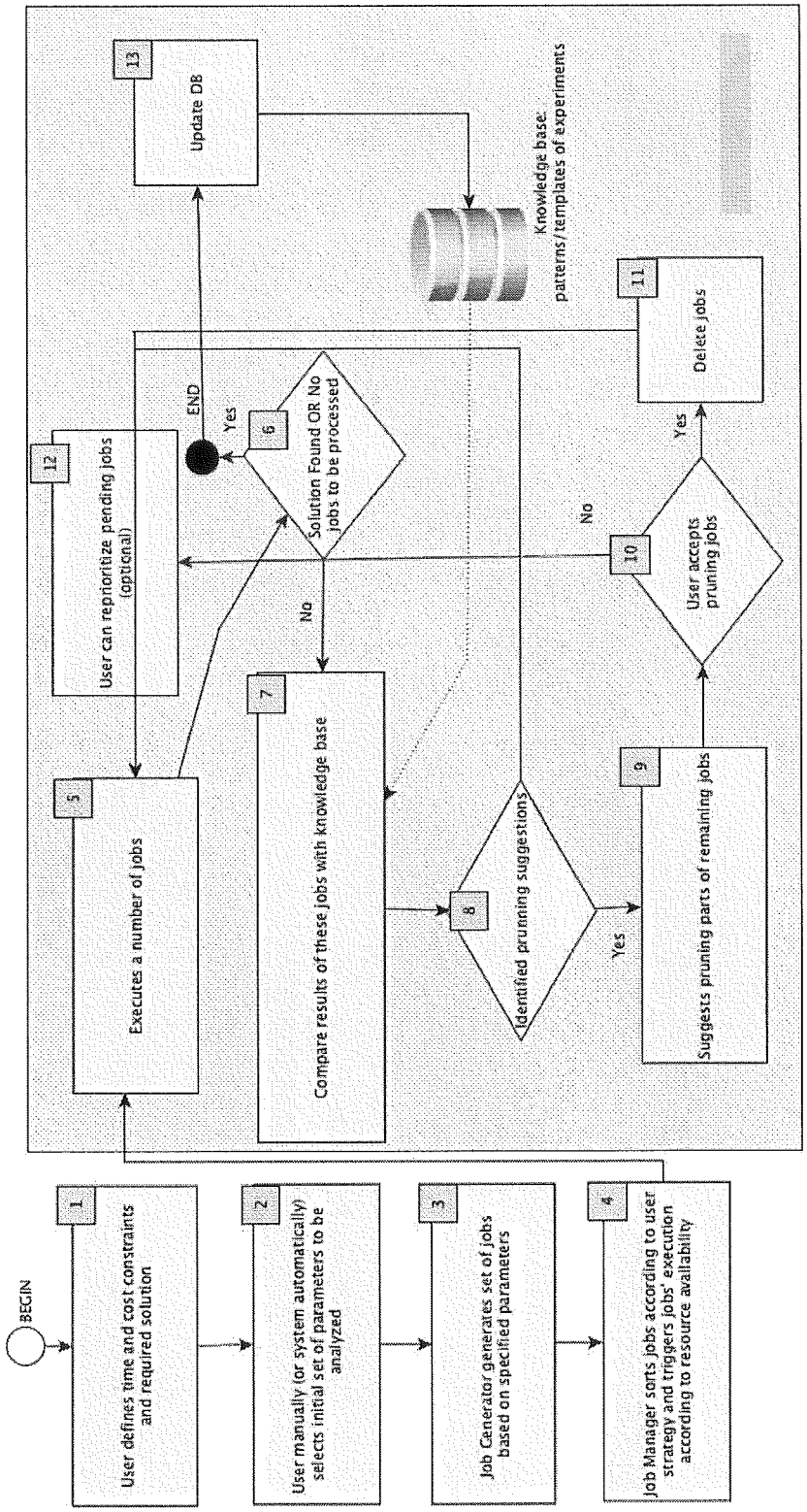
FIG. 6 is a flowchart illustrating a method 600, according to another exemplary aspect of the present invention.

FIG. 6 is a flowchart illustrating a method 600, according to another exemplary aspect of the present invention.

As illustrated in FIG. 6, the method 600 may include thirteen steps (Steps 1-13).

In Step 1, the user may define constraints (e.g., time and cost constraints) and a required solution.

In Step 2, an initial set of parameters is selected. This is may be done by either the user manually selecting the initial set of parameters, or by the system (e.g., system 200) automatically selecting the initial set of parameters, or by some combination of the manual selection and automatic selection.

In Step 3, the job generator (e.g., job generator 410a2 in FIG. 5) generates a set of jobs based on specified parameters.

In Step 4, the job manager (e.g., job manager 410a3 in FIG. 5) sorts jobs (in the set of jobs) according to user strategy, and triggers an execution of the jobs (e.g., by the job execution manager 410), according to resource availability.

In Step 5, the set of jobs generated in Step 3 is executed (e.g., by the job execution manager 410).

In Step 6, it is determined whether a solution (to the set of jobs) is found or whether there are no jobs (in the set of jobs) to be processed. If a solution is found or if there are no jobs to be processed, then the experiment (e.g., simulation experiment) is terminated, and the method moves to Step 13 where the templates in the knowledge base is updated based on the results of executing the set of jobs. If, on the other hand, no solution is found or there are jobs remaining to be processed, then the method 600 moves to step 7.

In Step 7, the results of the execution of the jobs in Step 5 is compared with templates from the knowledge base. The patterns may be evaluated for all parameters simultaneously.

In Step 8, it is determined whether pruning suggestions have been identified based on the comparison in Step 7. If not, then the method 600 returns to Step 5, and the set of jobs is executed. If, on the other hand, pruning suggestions (e.g., prunable jobs) have been identified, then the method 600 moves to Step 9.

Step 8 can be implemented through user preference learning models. For instance, Inductive logic programming (ILP) combines first-order logic and machine learning algorithms to produce user preference rules like IF price <=120 THEN user confidence <=0.05.

In Step 9, the system may suggest pruning parts of remaining jobs. For example, see FIG. 3. The "aggressiveness" of pruning suggestion can be a function of service level agreement (SLA) constraints (e.g., the tighter the deadline, the larger the prune).

In Step 10, it is determined whether the user accepts the pruning suggestion from Step 9. For example, the user may be prompted (e.g., by displaying a prompt to the user on a display device) to input his response to the pruning suggestion.

This may allow the system to leverage the user domain expertise, since the user will define the prunings that are suitable and according to SLA constraints (such as time/cost) ILP—the rule set can be derived from ILP whenever the user performs a pruning action in several problem instances that follow the same pattern (e.g., template). Further, the user may remain in the loop to make a suitable judgment for pruning actions.

The SLA is relevant because the user may not feel comfortable with the pruning. If the user has more time to run more jobs, he may want to do so to acquire more knowledge about the ongoing set of experiments. However, if the SLA is tight, he won't have much time, and he may take to risk to prune more than he should.

If the user accepts the pruning suggestions, then the method 600 moves to step 11 where the prunable jobs are deleted, and the method 600 then returns to Step 5 where the set of jobs excluding the deleted jobs are executed. If the user does not accept the pruning suggestions, then the method 600 moves to Step 12, where the user is allowed to re-prioritize the pending jobs, and then moves back to Step 5, where the set of jobs including the prunable jobs are executed.

In Step 12, based on intermediate results (and/or acquired knowledge) the user can reprioritize tasks. For example, a user may prioritize 80% of jobs for finding the desired solution and other 20% to hunt for similar a pattern (e.g., template) in the knowledge base.

In Step 13, parameter values that were far from giving good results or shapes of the analyzed experiments can be recorded. More than N experiments with similar features can be characterized as an experiment pattern (e.g., template).

The exemplary aspects of the present invention can be used in a variety of industries that have applications that would benefit from being executed with (e.g., need to be executed with) multiple parameter values.

For example, a flooding forecast service that needs to be deployed in a new city management center may benefit from the present invention. The service needs to be calibrated for that city by running the service with several parameters until it is able to generate results that are close to the real flooding values capture by sensors deployed in the city.

As another example, the financial sector contains applications for decision making based on execution of various scenarios, where each scenario contains a set of parameters with different values. Decisions have tight deadlines and therefore a limited number of scenarios can be evaluated. While the human is executing the scenarios, the system can determine if the strategy used by the user can achieve the deadline goal or a new strategy needs to be changed.

Referring to FIGS. 1-6, another aspect of the present invention is directed to a computer program product which may include, for example, a computer readable storage medium (hereinafter, the "storage medium") that may store computer readable program instructions (hereinafter, the "computer program" or "instructions") for performing the features and functions of the method 100 of determining a remediation action, and a system for determining a remediation action 200, 400 (e.g., memory included in the remediation action storage device 430). That is, the storage medium may store the instructions thereon for causing a processing device (e.g., computer, instruction execution device, computing device, computer processor, central processing unit (CPU), microprocessor, etc.) to perform a feature or function of the present invention.

The storage medium can be a tangible device that can retain and store the instructions for execution by the processing device. The storage medium may be, for example, but is not limited to, an electronic storage device, a magnetic storage device, an optical storage device, an electromagnetic storage device, a semiconductor storage device, or any suitable combination of the foregoing.

A non-exhaustive list of more specific examples of the storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

The storage medium, as used herein, should not be construed as merely being a "transitory signal" such as a radio wave or other freely propagating electromagnetic wave, an electromagnetic wave propagating through a waveguide or other transmission media (e.g., light pulses passing through a fiber-optic cable), or an electrical signal transmitted through a wire.

The processing device can access the instructions on the storage medium. Alternatively, the processing device can access (e.g., download) the instructions from an external computer or external storage device via a network such as the Internet, a local area network, a wide area network and/or a wireless network.

The network may include, for example, copper transmission cables, optical transmission fibers, wireless transmission, routers, firewalls, switches, gateway computers and/or edge servers. For example, the processing device may include a network adapter card or network interface which receives the instructions from the network and forwards the instructions to the storage medium within the processing device which stores the instructions.

The instructions for performing the features and functions of the present invention may include, for example, assembler instructions, instruction-set-architecture (ISA) instructions, machine instructions, machine dependent instructions, microcode, firmware instructions, state-setting data, or either source code or object code written in one or more programming languages (or combination of programming languages), including an object oriented programming language such as Java, Smalltalk, C++ or the like, and conventional procedural programming languages, such as the "C" programming language or similar programming languages.

The instructions may execute entirely on the processing device (e.g., a user's computer), partly on the processing device, as a stand-alone software package, partly on the processing device and partly on a remote computer or entirely on the remote computer or a server. For example, the instructions may execute on a remote computer which is connected to the processing device (e.g., user's computer) through a network such as a local area network (LAN) or a wide area network (WAN), or may execute on an external computer which is connected to the processing device through the Internet using an Internet Service Provider.

The processing device may include, for example, electronic circuitry including, for example, programmable logic circuitry, field-programmable gate arrays (FPGA), or programmable logic arrays (PLA) that may execute the instructions by utilizing state information of the instructions to personalize the electronic circuitry, in order to perform a feature or function of the present invention.

It should be noted that the features and functions of the present invention which are described above with reference to FIGS. 1-6 may be implemented by the processing device executing the instructions. That is, each block of the flowchart illustrations and/or block diagrams, and combinations of blocks in the flowchart illustrations and/or block diagrams, can be implemented by processing device executing the instructions.

The instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

That is, the instructions may be executed by a processing device to cause a series of operational steps to be performed by the processing device to produce a computer-implemented process, so that the executed instructions implement the features/functions/acts described above with respect to the flowchart and/or block diagram block or blocks of FIGS. 1-6.

Thus, the flowchart and block diagrams in the FIGS. 1-6 illustrate not only a method, system, apparatus or device, but also illustrate the architecture, functionality, and operation of the processing device executing the instructions. In this regard, each block in the flowchart or block diagrams may represent a module, segment, or portion of the instructions, which comprises one or more executable instructions for implementing the specified logical function(s). In some alternative implementations, the features or functions in the block may occur out of the order noted in the figures.

For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
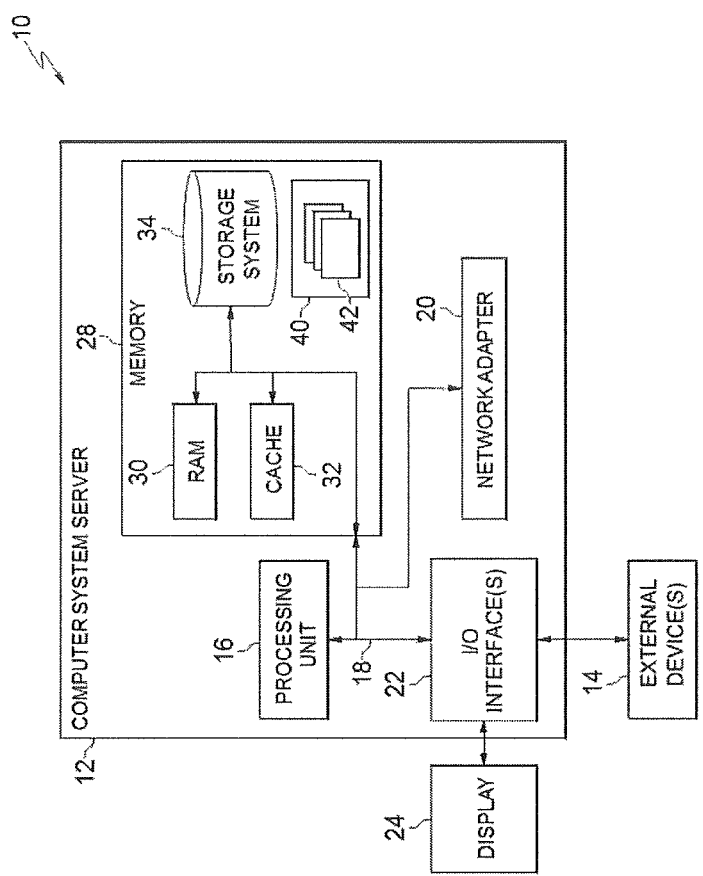
FIG. 7 depicts a cloud computing node according to an exemplary aspect of the present invention.
Figure 8:
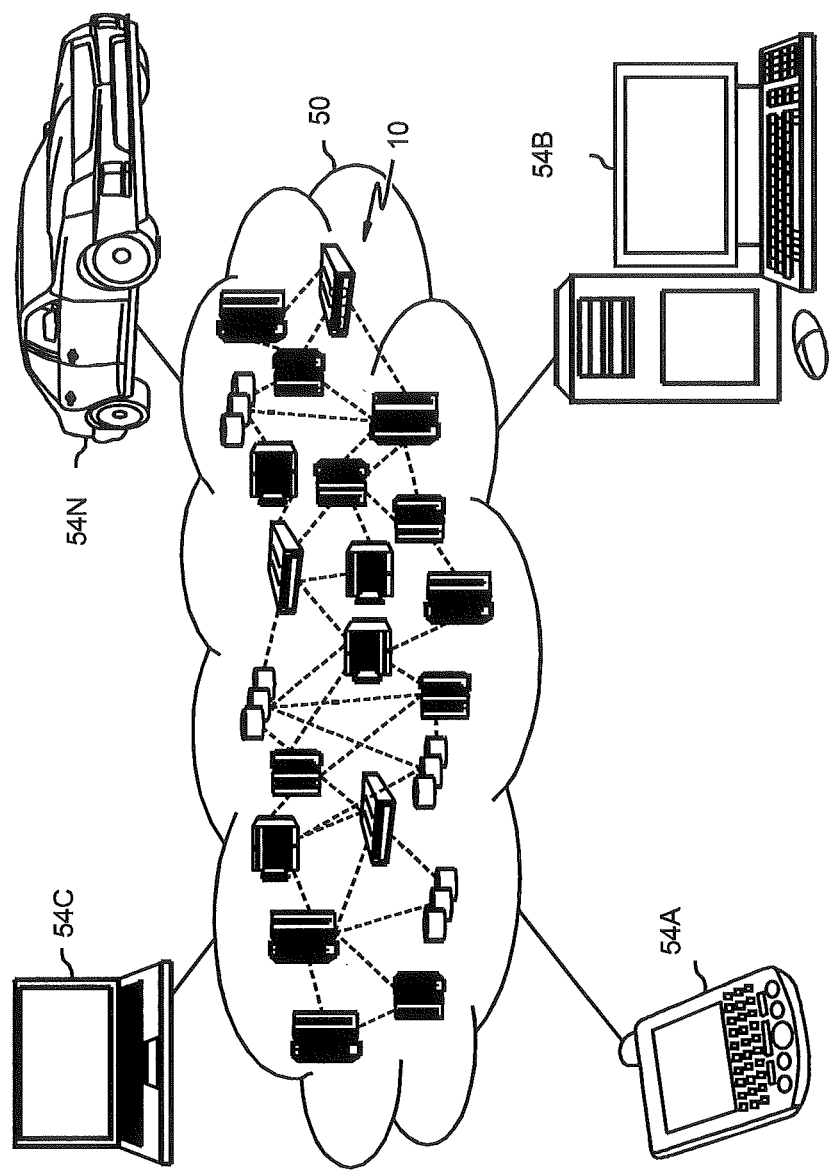
FIG. 8 depicts a cloud computing environment 50 according to an exemplary aspect of the present invention.
Figure 9:
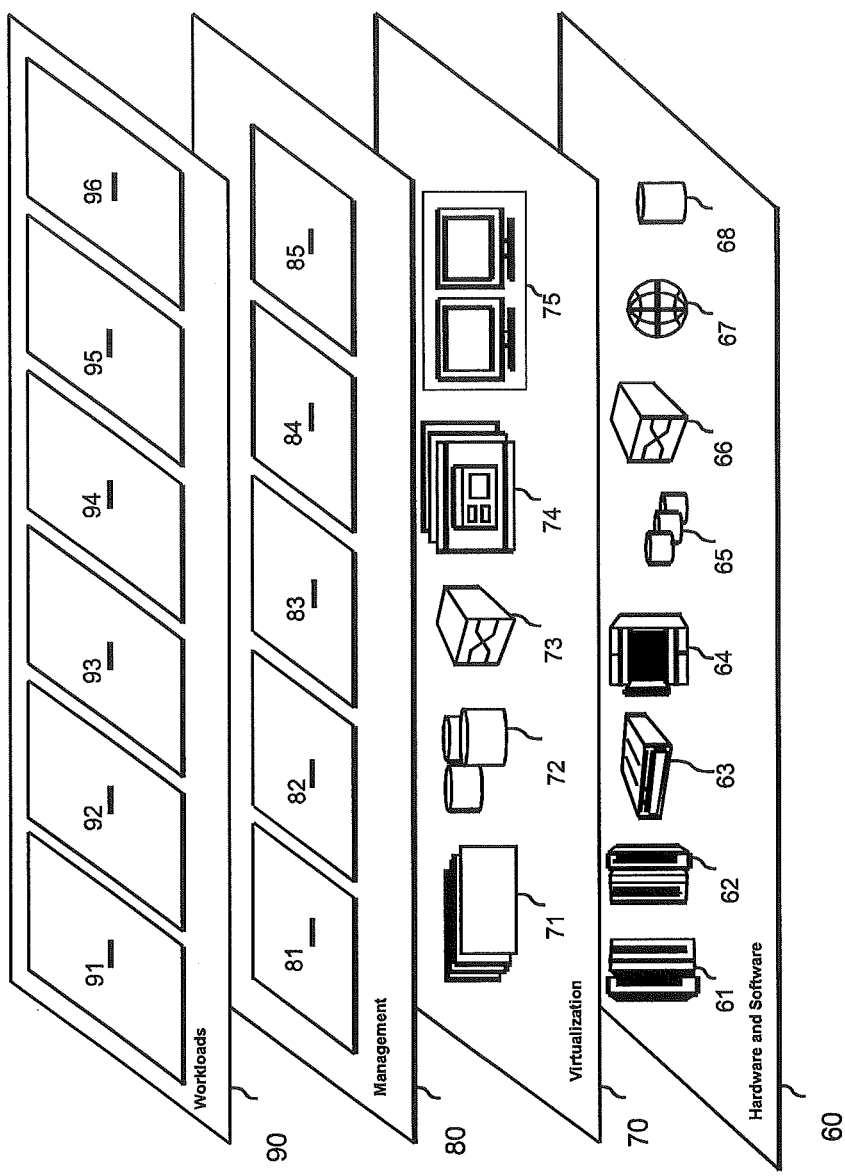
FIG. 9 depicts abstraction model layers according to an exemplary aspect of the present invention.

Referring again to the drawings, FIGS. 7-9 illustrate other exemplary aspects of the present invention.

It is to be understood that although this disclosure includes a detailed description on cloud computing, implementation of the teachings recited herein are not limited to a cloud computing environment. Instead, embodiments of the present invention are capable of being implemented in conjunction with any other type of computing environment now known or later developed. In particular, the embodiments of the present invention could be implemented in another kind of computational infrastructure such as a grid or cluster.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 9, a schematic of an example of a cloud computing node is shown. Cloud computing node 10 is only one example of a suitable node and is not intended to suggest any limitation as to the scope of use or functionality of embodiments of the invention described herein. Regardless, cloud computing node 10 is capable of being implemented and/or performing any of the functionality set forth herein.

Although cloud computing node 10 is depicted as a computer system/server 12, it is understood to be operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop circuits, multiprocessor systems, microprocessor-based systems, set top boxes, programmable consumer electronics, network PCs, minicomputer systems, mainframe computer systems, and distributed cloud computing environments that include any of the above systems or circuits, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing circuits that are linked through a communications network. In a distributed cloud computing environment, program modules may be located in both local and remote computer system storage media including memory storage circuits.

Referring again to FIG. 9, computer system/server 12 is shown in the form of a general-purpose computing circuit. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media. System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external circuits 14 such as a keyboard, a pointing circuit, a display 24, etc.; one or more circuits that enable a user to interact with computer system/server 12; and/or any circuits (e.g., network card, modem, etc.) that enable computer system/server 12 to communicate with one or more other computing circuits. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, circuit drivers, redundant processing units, external disk drive arrays, RAID systems, tape drives, and data archival storage systems, etc.

Referring now to FIG. 8, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof.

This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and conducting of experiments (e.g., as describe for Method 100) 96 in accordance with the present invention.

With its unique and novel features, the exemplary aspects of the present invention may assist a user (e.g., a human user) in guiding experiments in a way that maximizes business impact by modeling user behavior, predicting/simulating how such a behavior would fare, and providing feedback to the user.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method of conducting computing experiments, comprising:
    executing a set of jobs;
    performing a comparison of a result of the executed set of jobs with templates of previously-executed experiments which are stored in a knowledge base;
    generating a pruning suggestion that identifies a prunable job of the set of jobs based on the comparison and a user constraint; and
    prompting a user to accept or not accept the identified prunable job, by generating a display which prompts the user to input a response to the pruning suggestion.

2. The method of claim 1, further comprising:
    inputting the user constraint and a required solution, the user constraint comprising at least one of a time constraint, a cost constraint and a service level agreement constraint;
    selecting an initial set of parameters to be analyzed; and
    in a job generator:
        generating the set of jobs based on the selected initial set of parameters; and
        sorting the generated set of jobs according to user strategy and triggering the executing of the set of jobs according to resource availability.

3. The method of claim 2, wherein the selecting of the initial set of parameters is performed one of manually by the user and automatically by the job generator.

4. The method of claim 1, wherein the display displays a relationship between parameter values and goals.

5. The method of claim 4, wherein the display comprises a graph plotting parameter values versus goals.

6. The method of claim 1, further comprising:
if the user accepts the identified prunable job, then deleting the prunable job, and executing the set of jobs excluding the prunable job.

7. The method of claim 1, further comprising:
if the user does not accept the identified prunable job, then executing the set of jobs including the prunable job.

8. The method of claim 5, further comprising:
prior to executing the set of jobs, prompting the user to change a priority of the set of jobs.

9. The method of claim 1, further comprising:
after the executing of the set of jobs, determining whether the executing of the set of jobs results in a solution or whether there are no jobs to be executed.

10. The method of claim 9, wherein:
if it is determined that the executing of the set of jobs has resulted in a solution or that there are no jobs to be executed, then updating the templates in the knowledge base; and
if it is determined that the executing of the set of jobs has not resulted in a solution or that there are jobs to be executed, then performing the comparison of the result of the executed set of jobs with the templates of previously-executed experiments.

11. A system for conducting computing experiments, comprising:
a job executing module for executing a set of jobs;
a comparing module for performing a comparison of a result of the executed set of jobs with templates of previously-executed experiments stored in a knowledge base; and
a prunable job identifier for generating a pruning suggestion that identifies a prunable job of the set of jobs based on the comparison and a user constraint; and
a prompting module for prompting a user to accept or not accept the identified prunable job, by generating a display which prompts the user to input a response to the pruning suggestion.

12. The system of claim 11, further comprising:
an input device for inputting the user constraint and a required solution, the user constraint comprising at least one of a time constraint, a cost constraint and a service level agreement constraint, and selecting an initial set of parameters to be analyzed; and
a job generator for:
generating the set of jobs based on the selected initial set of parameters; and
sorting the generated set of jobs according to user strategy and triggering the executing of the set of jobs according to resource availability.

13. The system of claim 12, wherein the job generator prompts a user to select the initial set of parameters, or automatically selects of the initial set of parameters.

14. The system of claim 11, wherein the prompting module prompts the user to accept or not accept the identified prunable job, by generating a display for displaying a relationship between parameter values and goals.

15. The system of claim 14, wherein the display comprises a graph plotting parameter values versus goals.

16. The system of claim 11, further comprising:
a prunable job deleting module for, if the user accepts the identified prunable job, deleting the prunable job,
wherein the job executing module executes the set of jobs excluding the prunable job.

17. The system of claim 11, wherein if the user does not accept the identified prunable job, then the job executing module executes the set of jobs including the prunable job.

18. A computer program product for conducting computing experiments, the computer program product comprising a computer readable storage medium having program instructions embodied therewith, the program instructions executable by a computer to cause the computer to:
execute a set of jobs;
perform a comparison of a result of the executed set of jobs with templates of previously-executed experiments which are stored in a knowledge base; and
generating a pruning suggestion that identifies a prunable job of the set of jobs based on the comparison and a user constraint; and
prompt a user to accept or not accept the identified prunable job, by generating a display which prompts the user to input a response to the pruning suggestion.

* * * * *